United States Patent
Ito et al.

(10) Patent No.: US 10,439,363 B2
(45) Date of Patent: Oct. 8, 2019

(54) METHOD OF MANUFACTURING QUANTUM CASCADE LASER BEAM SOURCE

(71) Applicant: HAMAMATSU PHOTONICS K.K., Hamamatsu-shi, Shizuoka (JP)

(72) Inventors: Akio Ito, Hamamatsu (JP); Kazuue Fujita, Hamamatsu (JP); Daisuke Kawaguchi, Hamamatsu (JP); Tatsuo Dougakiuchi, Hamamatsu (JP); Tadataka Edamura, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 16/121,825

(22) Filed: Sep. 5, 2018

(65) Prior Publication Data

US 2019/0074664 A1    Mar. 7, 2019

(30) Foreign Application Priority Data

Sep. 6, 2017  (JP) ................. 2017-171343

(51) Int. Cl.
*H01S 5/028* (2006.01)
*H01S 5/34* (2006.01)
*H01S 5/22* (2006.01)

(52) U.S. Cl.
CPC ............ *H01S 5/3402* (2013.01); *H01S 5/028* (2013.01); *H01S 5/22* (2013.01)

(58) Field of Classification Search
None
See application file for complete search history.

(56) References Cited

U.S. PATENT DOCUMENTS

| 10,008,829 | B2* | 6/2018 | Dougakiuchi | H01S 5/3402 |
| 2015/0311665 | A1* | 10/2015 | Belkin | H01S 5/3402 |
| | | | | 372/20 |
| 2017/0077667 | A1* | 3/2017 | Williams | H01S 3/08059 |

OTHER PUBLICATIONS

Jung, S., et al., "Terahertz difference-frequency quantum cascade Laser sources on silicon," Optical Society of America, Jan. 2017, vol. 4, No. 1, pp. 38-43.

* cited by examiner

*Primary Examiner* — Bradley Smith
(74) *Attorney, Agent, or Firm* — Drinker Biddle & Reath LLP

(57) ABSTRACT

A method of manufacturing a quantum cascade laser beam source (1) includes: preparing a semiconductor stacked body (20); forming a pair of first excavated portions (41 and 42) and a ridge portion which is interposed between the pair of first excavated portions (41 and 42); forming channel structures (51 and 52) and circumferential edge portions (61 and 62) which are formed to interpose the channel structures (51 and 52) between the ridge portion (30) and the circumferential edge portion; forming an electrode pattern (81) in contact with a first area (29a) and forming an electrode pattern (82) in contact with a second area (22a); fixing a crystal growth surface side to a support substrate (91); removing an Fe-doped (semi-insulating) InP single-crystal substrate (21); fixing a Si substrate (93); and peeling the support substrate (91).

4 Claims, 8 Drawing Sheets

METHOD OF MANUFACTURING QUANTUM CASCADE LASER BEAM SOURCE

TECHNICAL FIELD

The present disclosure relates to a method of manufacturing a quantum cascade laser beam source.

BACKGROUND

A terahertz region with a wavelength of 15 μm to 300 μm (0.1 THz to 20 THz) is a region in which a semiconductor laser such as a quantum cascade laser has difficulty in operating at room temperature. A DFG-QCL beam source that outputs terahertz waves by difference frequency generation (DFG) in a middle infrared quantum cascade laser (QCL) oscillating in two wavelengths is known as a small terahertz (THz) light source which can operate at room temperature. In the DFG-QCL beam source, a stacked body that outputs terahertz waves is stacked on an Fe-doped (semi-insulating) indium phosphide (InP) single-crystal substrate. In general, there is a large absorption coefficient in a terahertz frequency band in Group III-V compound semiconductors such as InP and GaAs. Accordingly, in such a DFG-QCL beam source, there is a problem in that the Fe-doped (semi-insulating) InP single-crystal substrate can easily absorb terahertz waves and thus the output of terahertz waves decreases.

In this regard, a non-patent document (Optica p. 38-43, vol. 4, No. 1, January 2017 (Jung et al.,)) discloses a technique of removing an Fe-doped (semi-insulating) InP single-crystal substrate and employing a silicon (Si) substrate as a new substrate in the process of manufacturing a DFG-QCL beam source. A Si substrate less likely to absorb terahertz waves than an Fe-doped (semi-insulating) InP single-crystal substrate. Accordingly, it is possible to improve extraction efficiency of terahertz waves in a DFG-QCL beam source.

SUMMARY

However, a configuration in which an Fe-doped (semi-insulating) InP single-crystal substrate has been removed has a very thin structure and thus may not have sufficient strength to withstand various external forces at the time of manufacturing or the like. The present disclosure was invented in consideration of the above-mentioned circumstances and an objective thereof is to provide a method of manufacturing a quantum cascade laser beam source that can achieve high extraction efficiency of terahertz waves while securing sufficient strength.

A method of manufacturing a quantum cascade laser beam source according to an aspect of the present disclosure includes: a step of preparing a semiconductor stacked body in which a lower contact layer, a lower clad layer, a lower guide layer, an activation layer, and an upper guide layer are sequentially stacked on an indium phosphide substrate; a step of partially performing etching on the semiconductor stacked body to form a pair of first excavated portions in which the lower clad layer is exposed by the etching and a ridge portion which is interposed between the pair of first excavated portions; a step of partially performing etching on the pair of first excavated portions to form a second excavated portion in which the lower contact layer is exposed by the etching and a circumferential edge portion which is formed to interpose the second excavated portion between the ridge portion and the circumferential edge portion after a doped layer has grown in the first excavated portions and the upper clad layer and the upper contact layer have grown in the first excavated portions and the ridge portion; a step of forming an insulating film that excludes a first area which is a partial area of the upper contact layer in the ridge portion and a second area which is a partial area of the lower contact layer in the second excavated portion, forming a first electrode in contact with the first area, and forming a second electrode in contact with the second area to form a semiconductor element; a step of fixing a crystal growth surface side which is a side on which the first electrode and the second electrode are formed in the semiconductor element to a support substrate; a step of removing the indium phosphide substrate of the semiconductor element fixed to the support substrate; a step of fixing a silicon substrate to a surface of the semiconductor element from which the indium phosphide substrate has been removed; and a step of peeling the support substrate from the semiconductor element after the silicon substrate has been fixed.

In the method of manufacturing a quantum cascade laser beam source according to the present disclosure, after the semiconductor element has been formed, the indium phosphide substrate of the semiconductor element fixed to the support substrate is removed and a silicon substrate is bonded thereto instead of the indium phosphide substrate. In this way, by bonding a silicon substrate which is less likely to absorb terahertz waves instead of the indium phosphide substrate which is likely to absorb terahertz waves, it is possible to improve extraction efficiency of terahertz waves in a quantum cascade laser beam source using the semiconductor element.

Here, the semiconductor element from which the indium phosphide substrate has been removed has a very thin structure and thus may not withstand an external force (may not have sufficient strength) at the time of bonding a silicon substrate or the like thereafter. In the semiconductor element to which the silicon substrate is bonded, an electrode needs to be provided on the crystal growth surface side (the side on which the silicon substrate is not bonded), and an exposed portion of the upper contact layer and an exposed portion of the lower contact layer have a height difference. In this configuration, generally, only the ridge portions corresponding to the upper contact layer protrude. Accordingly, unevenness between the ridge portion and other portions on the surface fixed to the support substrate is large, the semiconductor element is not strongly fixed to the support substrate, and cracking or disconnection is likely to occur.

In this regard, in the method of manufacturing a quantum cascade laser beam source according to the present disclosure, a semiconductor element in which the circumferential edge portion is disposed on both sides of the ridge portion is formed. The circumferential edge portion is a portion which is formed by causing a doped layer to grow in the first excavated portion in which the lower clad layer is exposed and causing the upper clad layer and the upper contact layer to grow. Accordingly, similarly to the ridge portion which is formed by causing the upper clad layer and the upper contact layer to grow, the circumferential edge portion has a certain height. Accordingly, the semiconductor element has a configuration in which the thickness is larger than that in the related art and the strength is improved even in a state in which the indium phosphide substrate has been removed. Since the semiconductor element includes the circumferential edge portion, unevenness between the ridge portion and other portions on the surface fixed to the support substrate is small and the semiconductor element can be more easily brought into close contact with and strongly fixed to the support substrate in comparison with the related art. As a result, according to the present disclosure, it is possible to manufacture a quantum cascade laser beam source that can achieve high extraction efficiency of terahertz waves while securing sufficient strength.

In the method of manufacturing a quantum cascade laser beam source according to the present disclosure, the second area in which the lower contact layer is exposed is formed on both sides of the ridge portion and is formed in an area between the circumferential edge portion and the ridge portion (that is, an area close to the ridge portion). Accordingly, in the present disclosure, the second electrode in contact with the lower contact layer is formed on both sides of the activation layer to interpose the activation layer therebetween and is formed in an area close to the activation layer. When the electrode in contact with the contact layer is formed on only one side of the activation layer or when the electrode is formed to be greatly separated from the activation layer, a voltage drop increases and electric characteristics deteriorate. In this regard, in the present disclosure, since the second electrode is formed on both sides of the activation layer to interpose the activation layer therebetween and is formed in an area close to the activation layer as described above, the voltage drop is curbed.

The method may further include a step of making the semiconductor element into a chip by performing stealth dicing along a predetermined cutting line after the step of peeling the support substrate. In stealth dicing, since a cutting target is cut off from the inside, the cutting target can be cut out without damaging the cutting target in comparison with a case in which the cutting target is cut from the outside using a dicing blade or the like. In the present disclosure, since the stealth dicing is performed along the cutting line, scratching, cracking, or the like on the crystal growth surface or the like of the semiconductor element which has been made into a chip is prevented.

The step of forming the semiconductor element in the method may include forming the second electrode in contact with the second area to a surface of the circumferential edge portion along the insulating film covering the circumferential edge portion, and the method may further include: a step of preparing a sub mount on which a third electrode and a fourth electrode on both sides of the third electrode are formed; and a step of opposing a surface of the sub mount on which the third electrode and the fourth electrode are formed to a surface of the semiconductor element on which the first electrode and the second electrode are formed and connecting the semiconductor element to the sub mount by epi-side down assembly such that the first electrode is in contact with the third electrode and the second electrode is in contact with the fourth electrode after the step of making the semiconductor element into a chip.

As described above, a semiconductor element of a quantum cascade laser beam source which is manufactured by a manufacturing method in the related art has a configuration in which only the ridge portion corresponding to the upper contact layer protrudes, the electrode in contact with the exposed portion of the upper contact layer and the electrode in contact with the exposed portion of the lower contact layer have a height difference, and unevenness of the surface on which the electrodes are formed is large (a configuration with complicated electrode patterns). Connecting this semiconductor element to a sub mount by epi-side down assembly such that the electrodes are in contact with each other is difficult. In this regard, in the present disclosure, since the circumferential edge portions formed on both sides of the ridge portion have the same height as the ridge portion and the second electrode in contact with the second area is formed to the surface of the circumferential edge portion, the first electrode formed on the ridge portion and the second electrode formed on the circumferential edge portion can be set to the same height. Accordingly, the semiconductor element and the sub mount can be connected to each other by epi-side down assembly such that the first electrode is in contact with the third electrode of the sub mount and the second electrode is in contact with the fourth electrode of the sub mount. By connecting the semiconductor element and the sub mount by epi-side down assembly, heat generated from the semiconductor element can be efficiently dissipated to the sub mount and the semiconductor element can perform an operation in a higher-temperature environment, or an operation with a high duty cycle or a continuous operation in which a thermal load is large.

The step of forming the second excavated portion and the circumferential edge portion in the method may include forming the second excavated portion corresponding to the pair of first excavated portions at positions which are symmetric with the ridge portion interposed therebetween. Accordingly, distances by which the second electrodes on both sides are separated from the activation layer are the same and a voltage drop can be more suitably curbed.

According to the present disclosure, it is possible to provide a method of manufacturing a quantum cascade laser beam source that can achieve high extraction efficiency of terahertz waves while securing sufficient strength.

DETAILED DESCRIPTION

Hereinafter, an embodiment of the invention will be described with reference to the accompanying drawings. In the following description, the same elements or elements having the same functions will be referred to by the same reference signs and description thereof will not be repeated.

Figure 1:
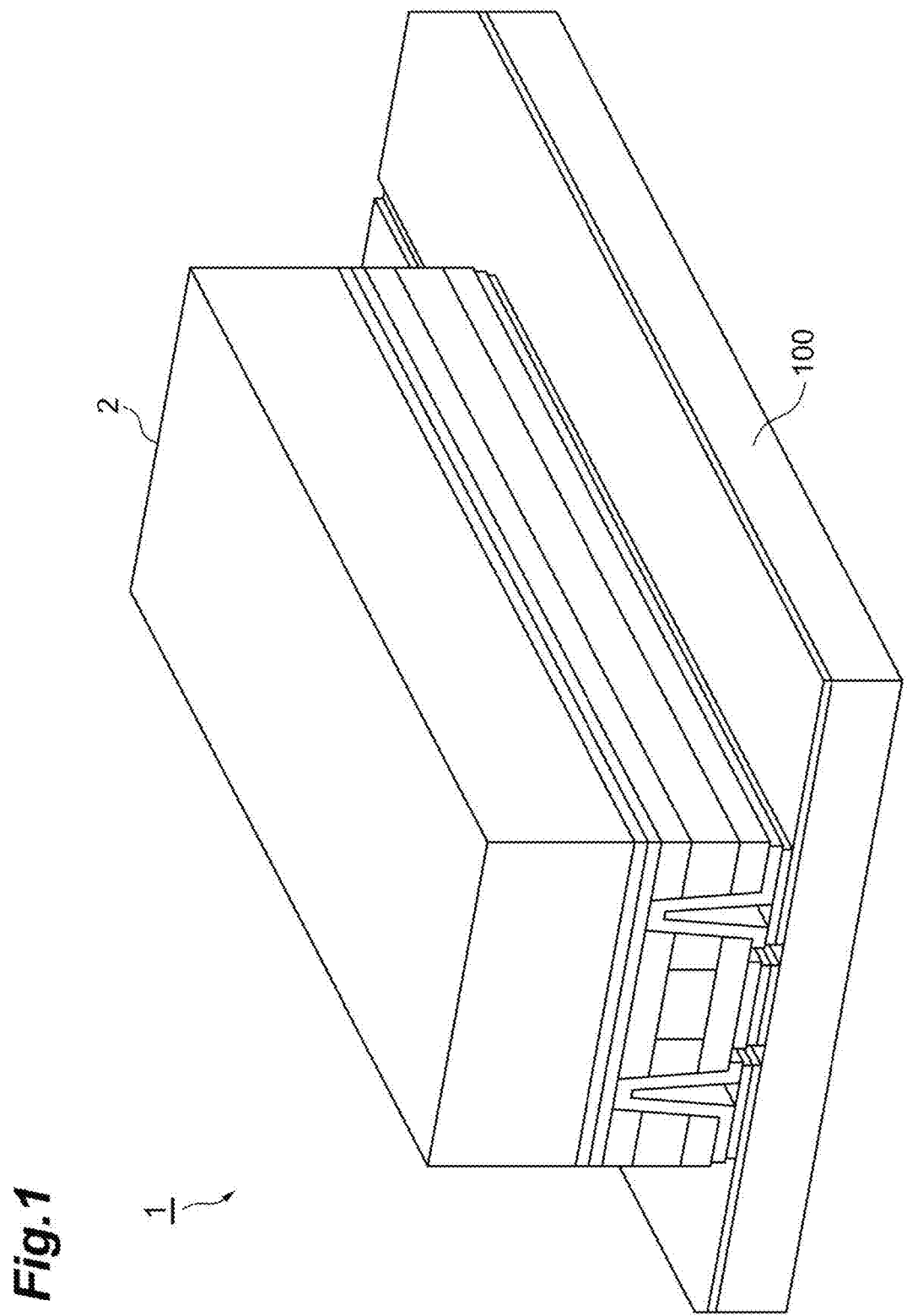
FIG. 1 is a perspective view schematically illustrating a quantum cascade laser beam source according to an embodiment.

FIG. 1 is a perspective view schematically illustrating a quantum cascade laser beam source 1 according to an embodiment. The quantum cascade laser beam source 1 according to the embodiment is a monopolar type laser element that generates a light beam using transition of electrons between subbands in a semiconductor quantum well structure. More specifically, the quantum cascade laser beam source 1 is a DFG-QCL beam source that outputs terahertz waves by differential frequency generation (DFG) in a middle infrared quantum cascade laser (QCL) oscillating in two wavelengths. The quantum cascade laser beam source 1 includes a semiconductor element 2 and a sub mount 100 to which the semiconductor element 2 is connected. The semiconductor element 2 is connected to the sub mount 100 by epi-side down assembly (details of which will be described later). A method of manufacturing the quantum cascade laser beam source 1 will be described below with reference to FIGS. 2A to 7. In the method of manufacturing the quantum cascade laser beam source 1, a crystal growth surface-side process, a temporary bonding process, a dicing process, and an assembly process are sequentially performed. A semiconductor element 8 in which electrode patterns have been formed (see FIG. 3C) is formed through the crystal growth surface-side process, a semiconductor element 9 in which a substrate has been replaced (see FIG. 4D) is formed through the temporary bonding process, a semiconductor element 2 made into a chip (see FIG. 6) is formed through the dicing process, and a quantum cascade laser beam source 1 in which the semiconductor element 2 has been connected to the sub mount 100 is formed through the assembly process.

Figure 5:
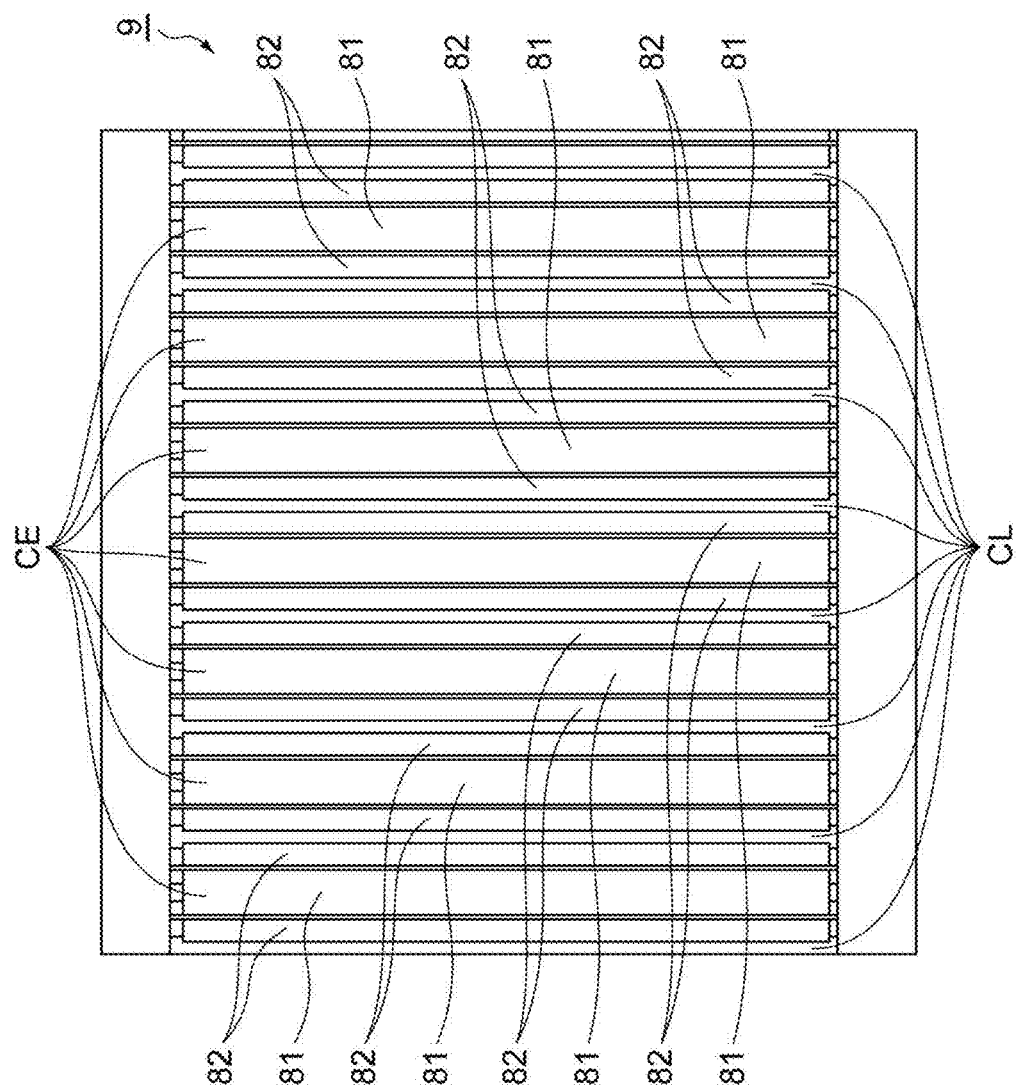
FIG. 5 is a plan view illustrating a semiconductor element before being diced.

The crystal growth surface-side process of the processes of manufacturing a quantum cascade laser beam source 1 will be described below with reference to FIGS. 2 and 3. The crystal growth surface-side process is a process of forming a semiconductor element in which an electrode is formed on a crystal growth surface side through crystal growth on an Fe-doped (semi-insulating) indium phosphide single-crystal substrate. FIGS. 2A to 2D and FIGS. 3A to 3C illustrate the crystal growth surface-side process in a time series. In FIGS. 2A to 2D and FIGS. 3A to 3C, only an area corresponding to one chip of the semiconductor element is illustrated, but the crystal growth surface-side process is actually performed for each panel-shaped member including areas corresponding to a plurality of chips as illustrated in FIG. 5.

Figure 2A:
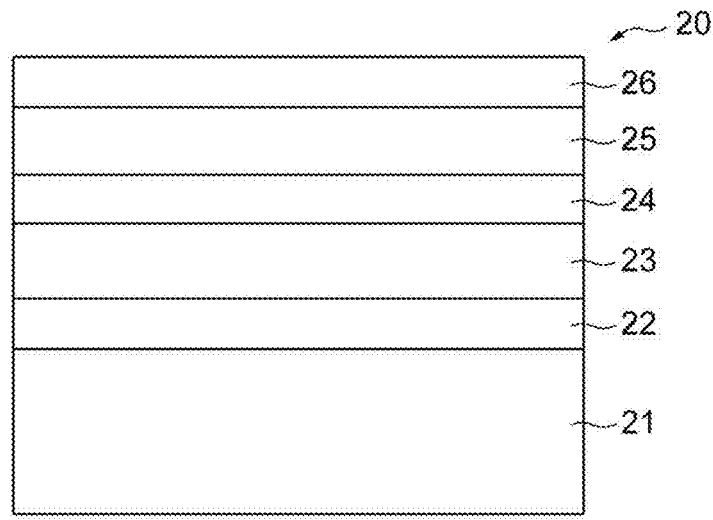
FIGS. 2A to 2D are diagrams illustrating processes of manufacturing a quantum cascade laser beam source and illustrating a crystal growth surface-side process.

In the crystal growth surface-side process, first, a semiconductor stacked body 20 (specifically, a wafer on which the semiconductor stacked body 20 has grown) is prepared (see FIG. 2A). The semiconductor stacked body 20 includes an Fe-doped (semi-insulating) indium phosphide (InP) single-crystal substrate 21 as a semiconductor substrate. In the semiconductor stacked body 20, an indium gallium arsenide (InGaAs) current diffusion layer 22 ($n=1.5\times10^{18}$ $cm^{-3}$) which is a lower contact layer with a thickness of 250 nm, a lower InP clad layer 23 (a lower clad layer) with a thickness of 5 μm, a lower InGaAs guide layer 24 (a lower guide layer) with a thickness of 250 nm, an activation layer 25 in which a plurality of unit stacked bodies are stacked in multiple stages, and an upper InGaAs guide layer 26 (an upper guide layer) with a thickness of 250 nm are sequentially stacked on the Fe-doped (semi-insulating) InP single-crystal substrate 21. Crystal growth in the following description is performed, for example, using a metal organic vapor phase epitaxy (MOVPE) method or a molecular beam epitaxy (MBE) method. A crystal growth surface in the following description is a surface on a side on which crystal growth is performed in the semiconductor stacked body 20 and is a surface on a side opposite to the side on which the Fe-doped (semi-insulating) InP single-crystal substrate 21 is provided.

Then, a diffraction grating is formed on the upper InGaAs guide layer 26. Acquired terahertz waves ω THz are determined by a differential frequency between $\omega_1$ generated in the activation layer 25 and $\omega_2$ selected by a cycle of the diffraction grating. For example, a diffraction grating with a depth of 150 nm is formed on the upper InGaAs guide layer 26.

Figure 2B:
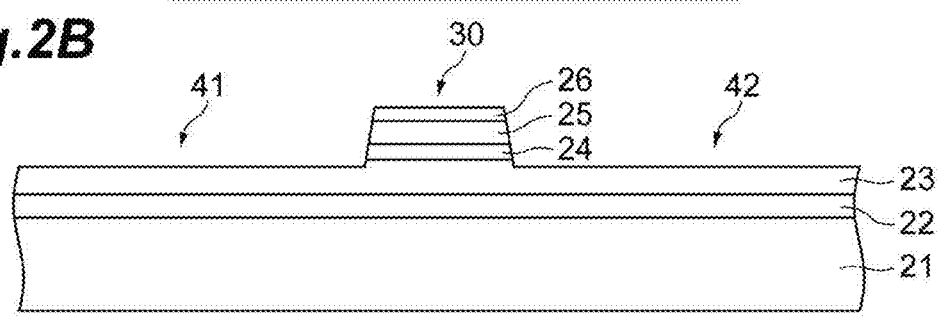

Then, a ridge portion 30 is formed on the semiconductor stacked body 20 (see FIG. 2B). Specifically, etching is partially performed on the semiconductor stacked body 20 to form a pair of first excavated portions 41 and 42 in which the lower InP clad layer 23 is exposed by the etching and a ridge portion 30 (a protruding portion which has not been etched) disposed between the pair of first excavated portions 41 and 42. The etching is performed, for example, using dry etching, wet etching, or both etching. The etching is performed to penetrate at least the upper InGaAs guide layer 26, the activation layer 25, and the lower InGaAs guide layer 24, and is performed up to the inside of the lower InP clad layer 23 or the interface between the lower InGaAs guide layer 24 and the lower InP clad layer 23.

Figure 2C:
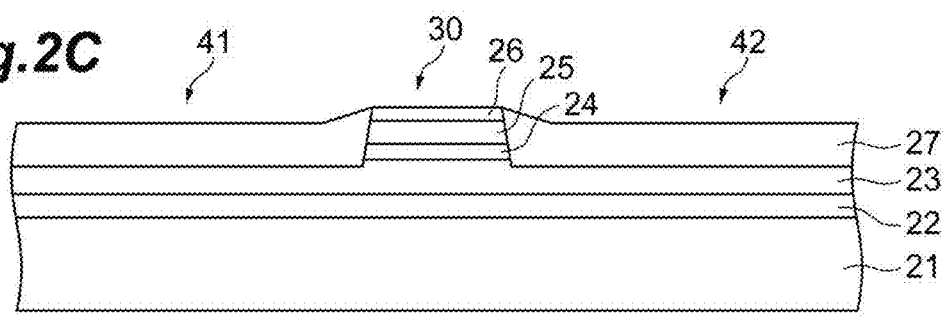

Then, an Fe-doped InP layer 27 is caused to grow to cover the side surfaces of the ridge portion 30 in the pair of first excavated portions 41 and 42 (see FIG. 2C). The Fe-doped InP layer 27 grows with a thickness of 2.5 μm to cover at least the side surfaces of the activation layer 25. In order to prevent the Fe-doped InP layer 27 from growing to the top of the ridge portion 30 (the top of the upper InGaAs guide layer 26), it is necessary to cover the top of the ridge portion 30 with a mask.

Figure 2D:
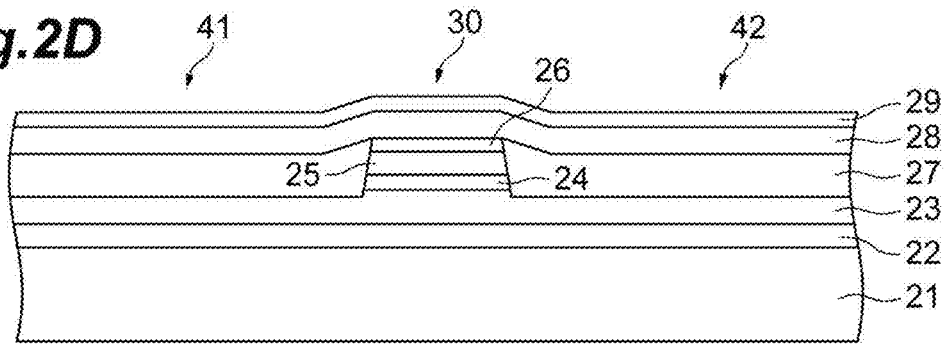

Then, after the Fe-doped InP layer 27 has grown, the mask is removed, and an upper InP clad layer 28 with a thickness of 5 μm and an InGaAs contact layer 29 ($n=5\times10^{18}$ $cm^{-3}$) which is an upper contact layer with a thickness of 250 nm are caused to grow on the entire surface including the first excavated portions 41 and 42 and the ridge portion 30 (see FIG. 2D).

Figure 3A:
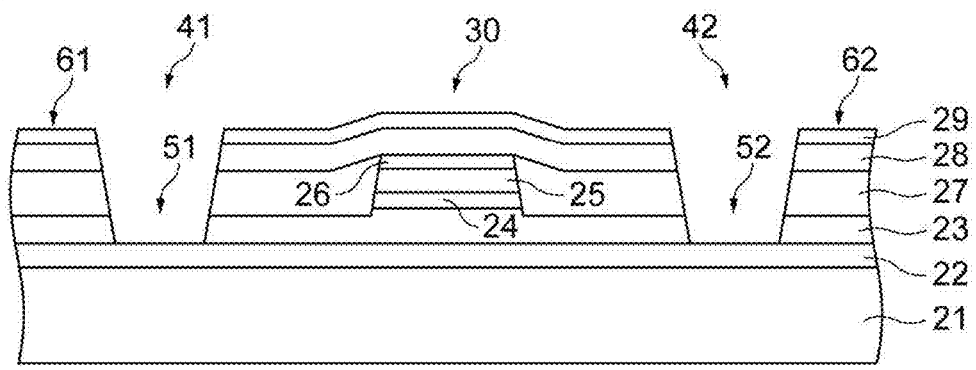
FIGS. 3A to 3C are diagrams illustrating processes of manufacturing a quantum cascade laser beam source and illustrating a crystal growth surface-side process.

Then, a pair of channel structures 51 and 52 (second excavated portions) are formed in the semiconductor stacked body 20 (see FIG. 3A). Specifically, etching is partially performed on the pair of first excavated portions 41 and 42 on both sides of the ridge portion 30 to form channel structures 51 and 52 in which the InGaAs current diffusion layer 22 is exposed by the etching and circumferential edge portions 61 and 62 (protruding portions which have not been etched) to interpose the channel structures 51 and 52 between the ridge portion 30 and the circumferential edge portions 61 and 62. More specifically, the channel structures 51 and 52 corresponding to the pair of first excavated portions 41 and 42 are formed at positions which are symmetric with the ridge portion 30 interposed therebetween (positions which are symmetric with respect to the center of the ridge portion 30). The channel structures 51 and 52 are formed, for example, with a width of 70 μm and are formed from a position separated 100 μm from the center of the ridge portion 30 to a position separated 170 μm therefrom. The width of the circumferential edge portions 61 and 62 are, for example, equal to or slightly greater than the width of the channel structures 51 and 52. The etching for forming the channel structures 51 and 52 is performed to penetrate at least the InGaAs contact layer 29, the upper InP clad layer 28, the Fe-doped InP layer 27, and the lower InP clad layer 23. The etching of the InGaAs contact layer 29 is performed, for example, using phosphoric acid, hydrogen peroxide water, and water. The etching of the upper InP clad layer 28, the Fe-doped InP layer 27, and the lower InP clad layer 23 is performed by selective etching using a hydrochloride-based etchant. Other etchants may be used or dry etching may be performed as long as the etching can be stopped at the interface of the InGaAs current diffusion layer 22 or at the inside of the InGaAs current diffusion layer 22.

Figure 3B:
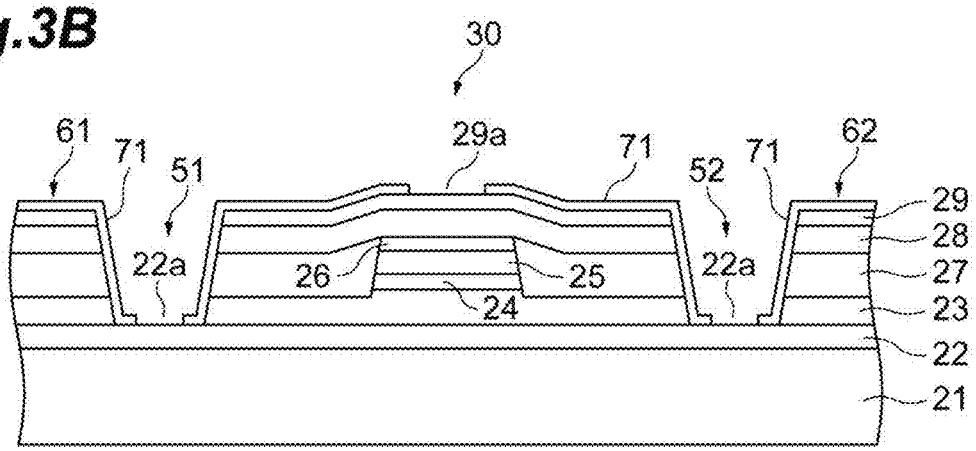

Then, an SiN insulating film 71 with a thickness of 250 nm is formed on the entire surface of the crystal growth surface side and then the SiN insulating film 71 is removed from only a first area 29a which is a partial area (for example, a central area) of the InGaAs contact layer 29 in the ridge portion 30 and a second area 22a which is a partial area of the InGaAs current diffusion layer 22 in the channel structures 51 and 52 (see FIG. 3B). That is, the SiN insulating film 71 is formed to exclude the first area 29a and the second area 22a.

Figure 3C:
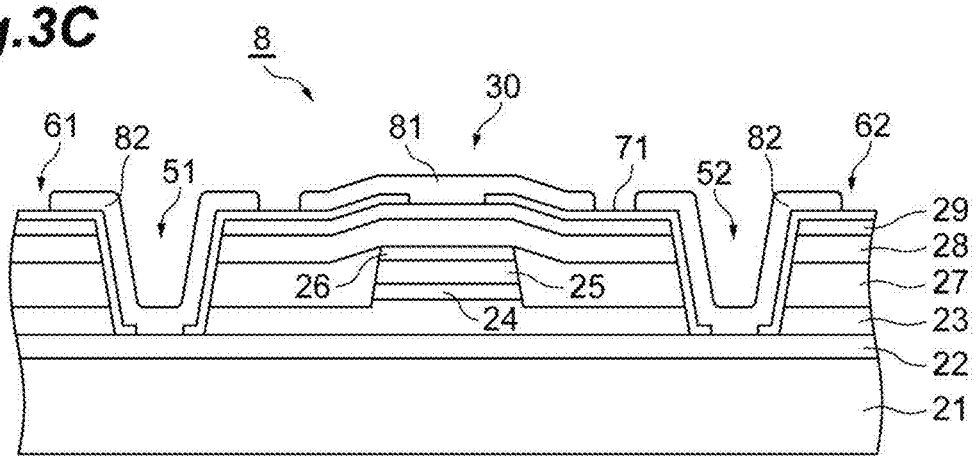

Then, electrode patterns 81 and 82 are formed to cover the channel structures 51 and 52 on the top and both sides of the ridge portion 30 (see FIG. 3C). Specifically, the electrode pattern 81 (a first electrode) is formed on the top of the ridge portion 30 to be in contact with the first area 29a, and the electrode pattern 82 (a second electrode) is formed on the channel structures 51 and 52 on both sides to be in contact with the second area 22a. The electrode pattern 82 is formed along groove shapes of the channel structures 51 and 52 and both ends (top ends) reach the surfaces of the circumferential edge portions 61 and 62 and the surface of the ridge portion 30. That is, the electrode pattern 82 in contact with the second area 22a is formed up to the surfaces of the circumferential edge portions 61 and 62 along the SiN insulating film 71 covering the circumferential edge portions 61 and 62. The electrode patterns 81 and 82 are electrically insulated from each other with the SiN insulating film 71 interposed therebetween. The electrode patterns 81 and 82 are formed of, for example, Au for an electrode. By employing Au as the electrode patterns 81 and 82, it is possible to improve mechanical strength of a semiconductor element. By forming the electrode patterns 81 and 82 on the crystal growth surface side and dividing the electrode patterns into three parts, injection of a current and application of a voltage can be performed from the crystal growth surface side. Through this crystal growth surface-side process, a semiconductor element 8 in which the electrode patterns 81 and 82 are formed on the crystal growth surface side.

The temporary bonding process after the crystal growth surface-side process has been completed among the processes of manufacturing the quantum cascade laser beam source 1 will be described below with reference to FIGS. 4A to 4D. The temporary bonding process is a process of replacing the Fe-doped (semi-insulating) InP single-crystal substrate 21 of the semiconductor element 8 with a silicon (Si) substrate after the semiconductor element 8 is temporarily bonded to a support substrate. FIGS. 4A to 4D illustrate the temporary bonding process in a time series. In FIGS. 4A to 4D, only an area corresponding to one chip of a semiconductor element is illustrated, but the temporary bonding process is actually performed for each panel-shaped member including areas corresponding to a plurality of chips as illustrated in FIG. 5.

Figure 4A:
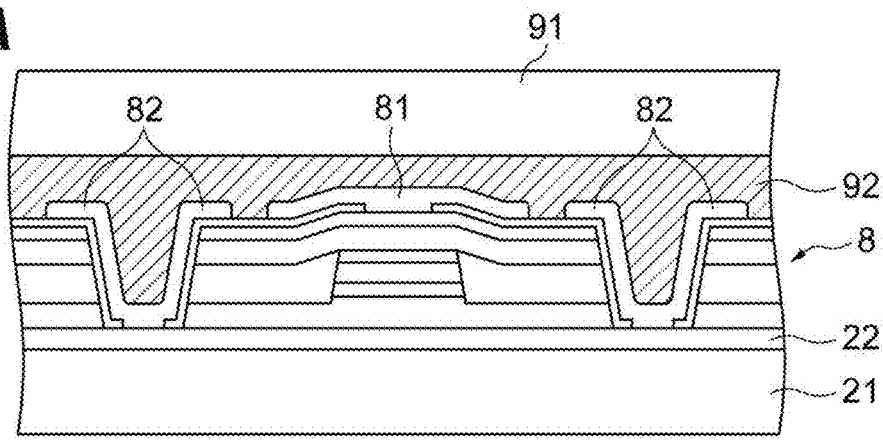
FIGS. 4A to 4D are diagrams illustrating processes of manufacturing a quantum cascade laser beam source and illustrating a temporary bonding process.

In the temporary bonding process, first the crystal growth surface side which is a side of the semiconductor element 8 on which the electrode patterns 81 and 82 are formed is fixed to a support substrate 91 (see FIG. 4A). Specifically, the crystal growth surface (that is, the semiconductor element 8) is fixed to the support substrate 8 by pressing the crystal growth surface of the semiconductor element 8 to the support substrate 91 in a state in which a temporary bonding wax 92 is applied to at least one of the crystal growth surface and a bonding surface of the support substrate 91.

Figure 4B:
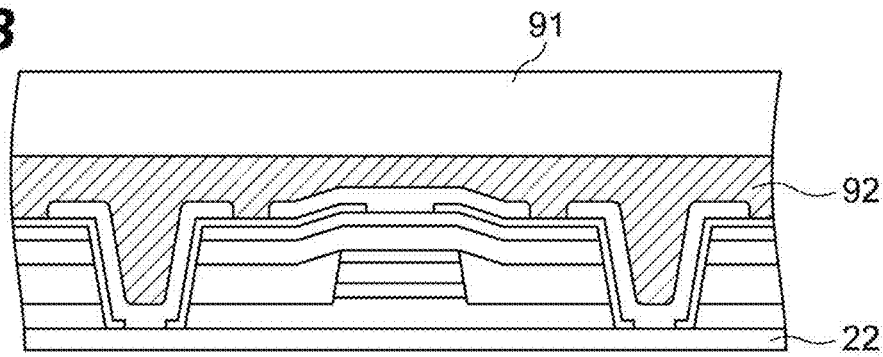

Then, the Fe-doped (semi-insulating) InP single-crystal substrate 21 of the semiconductor element 8 fixed to the support substrate 91 is removed (see FIGS. 4A and 4B). Specifically, first, the Fe-doped (semi-insulating) InP single-crystal substrate 21 is polished up to a remaining thickness of about 50 μm using polishing powder with a particle size of 3 μm. Thereafter, the Fe-doped (semi-insulating) InP single-crystal substrate 21 with a remaining thickness of 50 μm is etched using a solution in which hydrochloride and hydrogen peroxide are mixed at 1:1 and the Fe-doped (semi-insulating) InP single-crystal substrate 21 is completely removed to expose the InGaAs current diffusion layer 22.

Figure 4C:
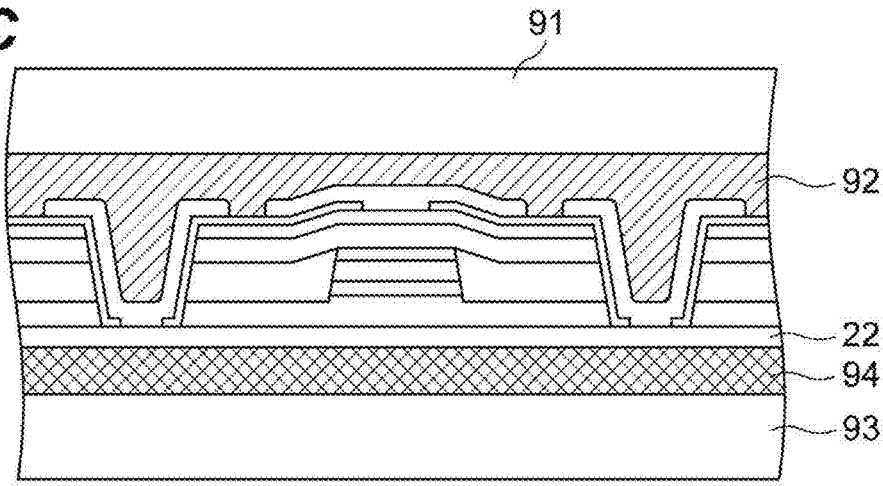

Then, an Si substrate 93 is fixed to the surface from which the Fe-doped (semi-insulating) InP single-crystal substrate 21 has been removed (see FIG. 4C). Specifically, for example, after a floating zone (FZ)-Si substrate 93 of 1 kΩ·cm or more is prepared and cleaned, a bonding resin 94 is applied to the Si substrate 93 using spin coating and the resultant is baked in a hot plate which has been heated to 100° C. for about one minute. The surface of the Si substrate 93 to which the bonding resin 94 has been applied is bonded to the InGaAs current diffusion layer 22 which has been exposed by removing the Fe-doped (semi-insulating) InP single-crystal substrate 21, and the resultant is heated at 200° C. for 15 minutes with pressurization of about 3 MPa. The bonding resin 94 has only to transmit wavelengths of terahertz waves generated in the activation layer 25, and, for example, a resin with transmittance of 80% or more and with a refractive index close to that of InP or a resin with a thickness of 200 nm after being heated is used. Specifically, for example, a CYCLOTENE resin is used as the bonding resin 94.

Figure 4D:
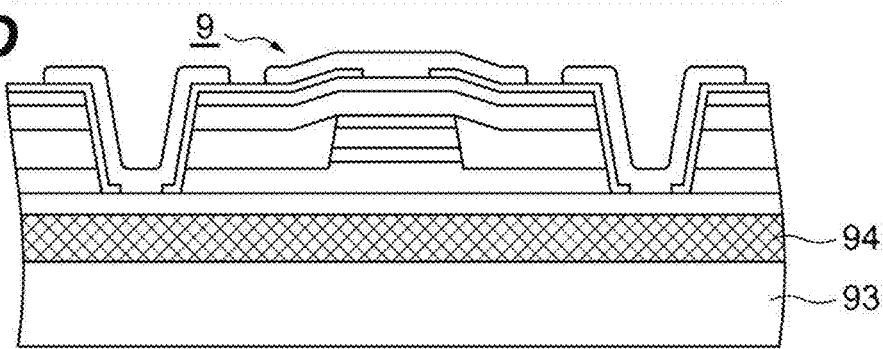

Then, after the Si substrate 93 has been fixed to the InGaAs current diffusion layer 22 by heating, the support substrate 91 is peeled and the temporary bonding wax 92 left on the crystal growth surface is removed (see FIG. 4D). Through this temporary bonding process, a semiconductor element 9 in which the Si substrate 93 is bonded instead of the Fe-doped (semi-insulating) InP single-crystal substrate 21 is formed.

Figure 6:
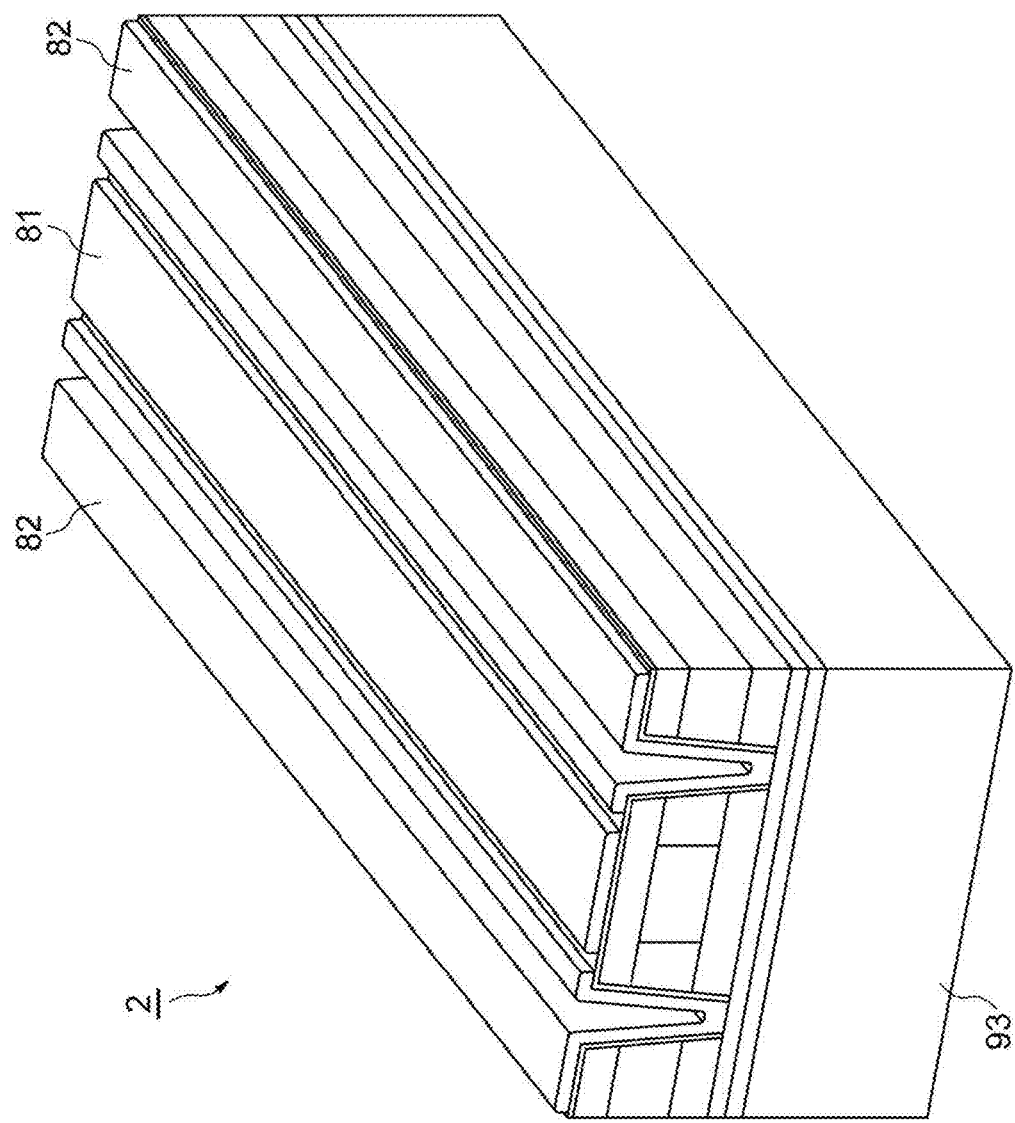
FIG. 6 is a perspective view schematically illustrating a semiconductor element made into a chip.

The dicing process after the temporary bonding process has been completed among the processes of manufacturing the quantum cascade laser beam source 1 will be described below with reference to FIGS. 5 and 6. The dicing process is a process of making the semiconductor element 9 into a chip. FIG. 5 is a plan view illustrating the semiconductor element 9 before being diced. FIG. 6 is a perspective view schematically illustrating the semiconductor element 2 which has been made into a chip. After the process of peeling the support substrate 91, the semiconductor element 9 which is a panel-shaped member including areas corresponding to a plurality of chips (chip-corresponding areas CE) is made into chips to form semiconductor elements 2 as chips (see FIG. 6) by performing stealth dicing along cutting lines CL illustrated in FIG. 5. The cutting line CL extends between neighboring chip-corresponding areas CE, and is more specifically formed between the electrode patterns 82 of the neighboring chip-corresponding areas CE. In the stealth dicing, first, a stealth dicing (SD) layer is formed. Specifically, a dicing tape is attached to the Si substrate 93 side such that the crystal growth surface is not damaged, and a laser beam is applied to the cutting line CL from the dicing tape side. Application of a laser beam is performed at a processing speed of 400 mm/s, for example, using a laser beam with a wavelength 1342 nm and a pulse width of 90 nm. Accordingly, the SD layer is formed in the Si substrate 93. By generating a vertical crack perpendicular to the front and rear surfaces of the semiconductor element 9 with the formed SD layer as a start point, the semiconductor element 9 is cut off from the inside. It is possible to perform dicing without causing scratching or cracking in the crystal growth surface by forming the SD layer in an area in the Si substrate 93 close to the InGaAs current diffusion layer 22 (for example, an area separated about 40 µm from the InGaAs current diffusion layer 22) and then forming the SD layer at intervals of 200 µm. When a laser beam is applied, aberration correction is arbitrarily performed using a LCOS depending on a processing depth.

Figure 7:
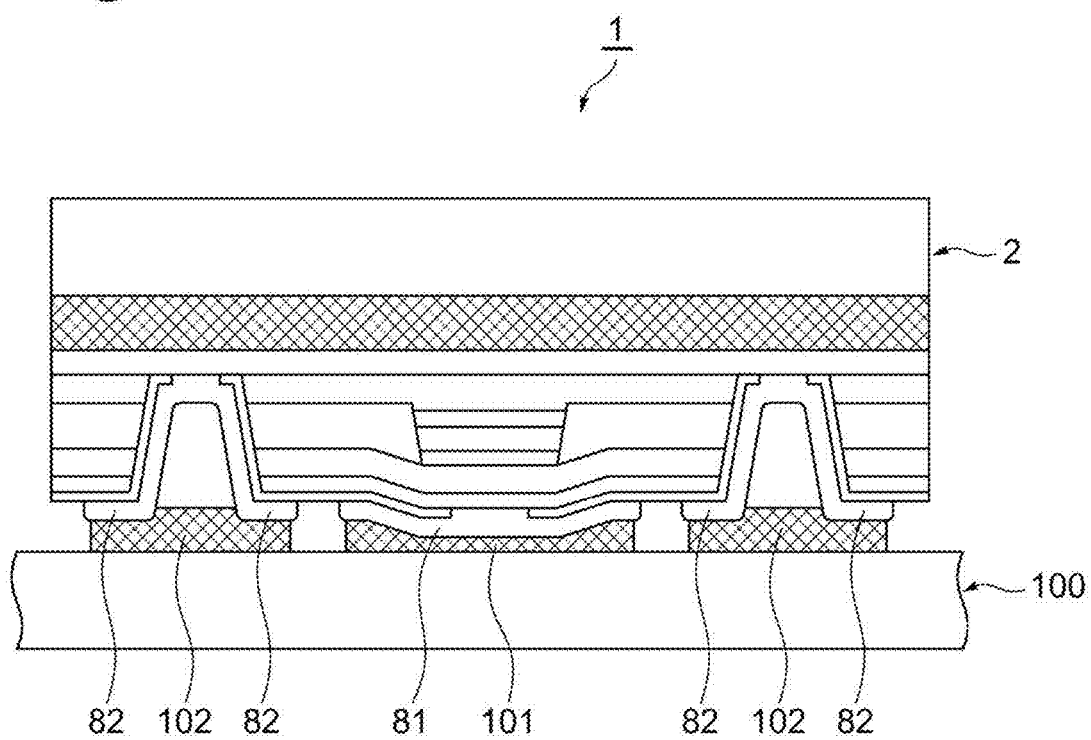
FIG. 7 is a front view illustrating a semiconductor element which is connected to a sub mount by epi-side down assembly.

The assembly process after the dicing process has been completed among the processes of manufacturing a quantum cascade laser beam source 1 will be described below with reference to FIG. 7. The assembly process is a process of connecting the semiconductor element 2 as a chip to a sub mount 100 by epi-side down assembly to form a quantum cascade laser beam source 1. FIG. 7 is a front view illustrating a semiconductor element 2 connected to a sub mount 100 by epi-side down assembly. After the process of making the semiconductor element into chips, the sub mount 100 illustrated in FIG. 7 is prepared and the semiconductor element 2 is connected to the sub mount 100 by epi-side down assembly. A metal portion 101 (a third electrode) corresponding to the electrode pattern 81 of the semiconductor element 2 and a metal portion 102 corresponding to the electrode pattern 82 of the semiconductor element 2 and disposed on both sides of the metal portion 101 are provided in the sub mount 100.

The surface of the sub mount 100 on which the metal portions 101 and 102 are formed and the surface of the semiconductor element 2 on which the electrode patterns 81 and 82 are formed are opposed to each other, and the semiconductor element 2 is connected to the sub mount 100 by epi-side down assembly such that the electrode pattern 81 is in contact with the metal portion 101 and the electrode pattern 82 is in contact with the metal portion 102. Through these processes, the semiconductor element 2 is connected to the sub mount 100 and the quantum cascade laser beam source 1 is manufactured.

Operational advantages of the method of manufacturing a quantum cascade laser beam source 1 will be described below.

A DFG-QCL beam source that outputs terahertz waves by difference frequency generation in a middle infrared quantum cascade laser oscillating in two wavelengths is known as a small terahertz (THz) light source which can operate at room temperature. In the DFG-QCL beam source, there is a problem in that terahertz waves generated in the activation layer are absorbed in the Fe-doped (semi-insulating) InP single-crystal substrate and thus the output of terahertz waves decreases extremely to several µW. In order to solve this problem, for example, a method of applying Cherenkov phase matching is known. This method is to improve extraction efficiency of terahertz waves by polishing the end surface of the semiconductor element to 20° to 30° with a notice that terahertz waves are emitted obliquely from the semiconductor element due to refractive index dispersion. However, since a quantity absorbed by the Fe-doped (semi-insulating) InP single-crystal substrate is great, a satisfactory output cannot also be secured using this method. In the method, since the end portion of each semiconductor element as a chip needs to be polished, work is complicated and the method is not suitable for mass production of the semiconductor element.

Figure 8:
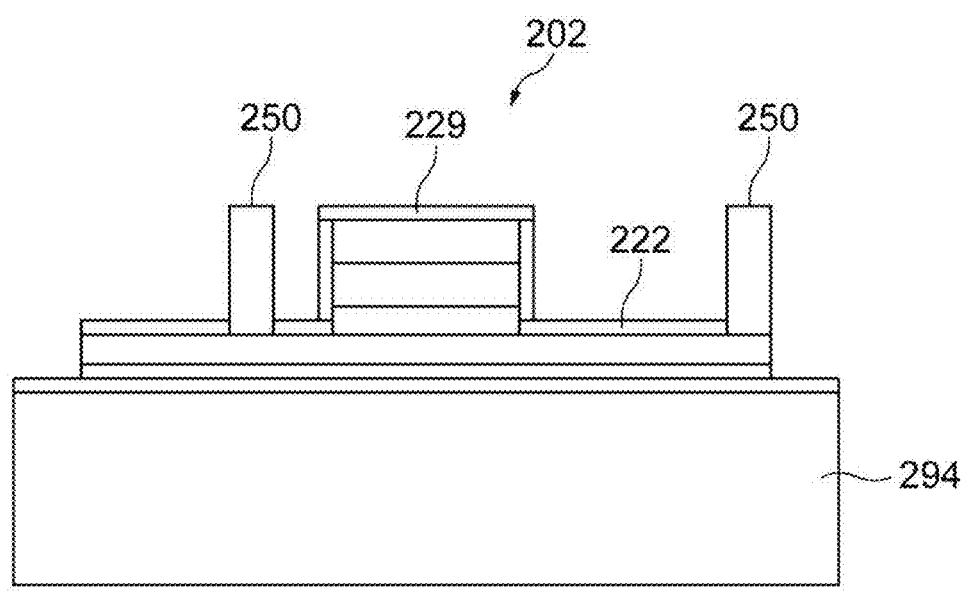
FIG. 8 is a front view illustrating a semiconductor element of a quantum cascade laser beam source according to a comparative example.

As another method, a method of improving extraction efficiency of terahertz waves by removing the Fe-doped (semi-insulating) InP single-crystal substrate and bonding an Si substrate of which an amount of absorbed terahertz waves is small instead of the Fe-doped (semi-insulating) InP single-crystal substrate is known. According to this method, it is possible to greatly improve extraction efficiency of terahertz waves. Here, the semiconductor element from which the Fe-doped (semi-insulating) InP single-crystal substrate has been removed has a very thin structure, and thus may not withstand an external force (may not have a sufficient strength) at the time of bonding the Si substrate or the like thereafter. As in a comparative example illustrated in FIG. 8, in a semiconductor element 202 to which an Si substrate 294 has been bonded, it is necessary to form an electrode on the crystal growth surface side (the side to which the Si substrate 294 has not been bonded), and an exposed portion of an InGaAs contact layer 229 which is an upper contact layer and an exposed portion of an InGaAs current diffusion layer 222 which is a lower contact layer have a height difference of, for example, about 10 µm. In this configuration, generally, only a ridge portion 230 corresponding to the InGaAs contact layer 229 protrudes. Accordingly, unevenness between the ridge portion 230 and other portions on the surface fixed to the support substrate at the time of replacement with the Si substrate is large, the semiconductor element 202 is not strongly fixed to the support substrate, and cracking or disconnection is likely to occur.

In order to solve the above-mentioned problem, the method of manufacturing a quantum cascade laser beam source 1 according to this embodiment includes: a step of preparing the semiconductor stacked body 20 in which the InGaAs current diffusion layer 22, the lower InP clad layer 23, the lower InGaAs guide layer 24, the activation layer 25, and the upper InGaAs guide layer 26 are sequentially stacked on the Fe-doped (semi-insulating) InP single-crystal substrate 21; a step of partially performing etching on the semiconductor stacked body 20 to form a pair of first excavated portions 41 and 42 in which the lower InP clad layer 23 is exposed by the etching and the ridge portion 30 which is interposed between the pair of first excavated portions 41 and 42; a step of partially performing etching on the pair of first excavated portions 41 and 42 to form the channel structures 51 and 52 in which the InGaAs current diffusion layer 22 is exposed by the etching and the circumferential edge portions 61 and 62 which are formed to interpose the channel structures 51 and 52 between the ridge portion 30 and the circumferential edge portions after the Fe-doped InP layer 27 has grown in the first excavated portions 41 and 42 and the upper InP clad layer 28 and the InGaAs contact layer 29 have grown in the first excavated portions 41 and 42 and the ridge portion 30; a step of forming the SiN insulating film 71 that excludes the first area 29a which is a partial area of the InGaAs contact layer 29 in the ridge portion 30 and the second area 22a which is a partial area of the InGaAs current diffusion layer 22 in the channel structures 51 and 52, forming the electrode pattern 81 in contact with the first area 29a, and forming the electrode pattern 82 in contact with the second area 22a to form a semiconductor element 8; a step of fixing the crystal growth surface side which is a side on which the electrode pattern 81 and the electrode pattern 82 are formed in the semiconductor element 8 to the support substrate 91; a step of removing the Fe-doped (semi-insulating) InP single-crystal substrate 21 of the semiconductor element 8 fixed to the support substrate 91; a step of fixing the Si substrate 93 to the surface from which the Fe-doped (semi-insulating) InP single-crystal substrate 21 has been removed; and a step of peeling the support substrate 91 after the Si substrate 93 has been fixed.

In the method of manufacturing a quantum cascade laser beam source 1 according to this embodiment, after the semiconductor element 8 has been formed, the Fe-doped (semi-insulating) InP single-crystal substrate 21 of the semiconductor element 8 fixed to the support substrate 91 is removed and the Si substrate 93 is bonded instead of the Fe-doped (semi-insulating) InP single-crystal substrate 21. In this way, by bonding the Si substrate 93 which is less likely to absorb terahertz waves (in which an absorbed quantity is about 1/100 of that of the Fe-doped (semi-insulating) InP single-crystal substrate at a wavelength of 3 THz) instead of the Fe-doped (semi-insulating) InP single-crystal substrate 21 which is likely to absorb terahertz waves, it is possible to improve extraction efficiency of terahertz waves in the quantum cascade laser beam source 1 by applying the Cherenkov phase matching. In this case, similarly to the Fe-doped (semi-insulating) InP single-crystal substrate 21, terahertz waves are emitted obliquely from the semiconductor element due to refractive index dispersion, but the refractive index of the Si substrate is less than that of InP and thus it is possible to extract an output of terahertz waves without polishing. Terahertz waves are refracted and emitted at about 40° toward the Si substrate 93 at the interface between the semiconductor and the air. The output of terahertz waves in the configuration using the Si substrate increases to five to eight times that when the Fe-doped (semi-insulating) InP single-crystal substrate is used.

In the method of manufacturing a quantum cascade laser beam source 1, the semiconductor element 9 in which the circumferential edge portions 61 and 62 are formed on both sides of the ridge portion 30 is formed. The circumferential edge portions 61 and 62 are portions which are formed by causing a doped layer to grow in the first excavated portions 41 and 42 in which the lower InP clad layer 23 is exposed and causing the upper InP clad layer 28 and the InGaAs contact layer 29 to grow. Accordingly, similarly to the ridge portion 30 which is formed by causing the upper InP clad layer 28 and the InGaAs contact layer 29 to grow, the circumferential edge portions 61 and 62 have a certain height (see FIG. 3C or the like). Accordingly, the semiconductor element has a configuration in which the thickness is larger than that in the related art even in a state in which the Fe-doped (semi-insulating) InP single-crystal substrate 21 has been removed (see FIG. 4B), and the strength thereof is improved. Since the semiconductor element includes the circumferential edge portions 61 and 62, unevenness between the ridge portion 30 and other portions on the surfaces fixed to the support substrate 91 is small and the semiconductor element is more easily brought into close contact with and strongly fixed to the support substrate 91 in comparison with the related art. As a result, in the manufacturing method according to this embodiment, it is possible to manufacture a quantum cascade laser beam source 1 that can achieve high extraction efficiency of terahertz waves while securing a sufficient strength.

In the manufacturing method according to this embodiment, the second area 22a in which the InGaAs current diffusion layer 22 is exposed is formed on both sides of the ridge portion 30 and is formed in an area between the circumferential edge portions 61 and 62 and the ridge portion 30 (that is, an area close to the ridge portion 30) (see FIG. 3B or the like). Accordingly, in the present disclosure, the electrode pattern 82 in contact with the InGaAs current diffusion layer 22 is formed on both sides of the activation layer 25 with the activation layer 25 interposed therebetween and is formed in an area close to the activation layer 25 (see FIG. 3C or the like). When the electrode in contact with the contact layer is formed on only one side of the activation layer or is formed to be greatly separated from the activation layer, a voltage drop increases and electric characteristics deteriorate. In this regard, in the manufacturing method according to this embodiment, since the electrode pattern 82 in contact with the InGaAs current diffusion layer 22 which is the lower contact layer is formed on both sides the activation layer 25 with the activation layer 25 interposed therebetween and is formed in the area close to the activation layer 25, the voltage drop is curbed.

The manufacturing method according to this embodiment further includes a process of making the semiconductor element 9 into a chip and forming a semiconductor element 2 (see FIG. 6) as a chip by performing stealth dicing along the predetermined cutting lines CL illustrated in FIG. 5 after the temporary bonding process including a step of peeling the support substrate 91 (see FIG. 4D). In the stealth dicing, since a cutting target is cut off from the inside, the cutting target can be cut at a high speed without damaging the cutting target in comparison with a case in which the cutting target is cut from the outside using a dicing blade or the like. By performing the stealth dicing along the cutting lines CL, scratching or cracking in the crystal growth surface of the semiconductor element 2 as a chip is prevented, the output decrease of terahertz waves serving as a problem when the scratching or cracking occurs is curbed, and the speed of making the semiconductor element into a chip by dicing increases.

In the manufacturing method according to this embodiment, the step of forming the semiconductor element 8 includes forming the electrode pattern 82 in contact with the second area 22a to the surfaces of the circumferential edge portions 61 and 62 along the SiN insulating film 71 covering the circumferential edge portions 61 and 62 (see FIG. 3C), and the method further includes: a step of preparing the sub mount 100 on which the metal portion 101 and the metal portion 102 on both sides of the metal portion 101 are formed (see FIG. 7); and a step of opposing the surface of the sub mount 100 on which the metal portion 101 and the metal portion 102 are formed to the surface of the semiconductor element 2 on which the electrode pattern 81 and the electrode pattern 82 are formed and connecting the semiconductor element 2 to the sub mount 100 by epi-side down assembly such that the electrode pattern 81 is in contact with the metal portion 101 and the electrode pattern 82 is in contact with the metal portion 102 after the step of dicing the semiconductor element into a chip.

A semiconductor element of a quantum cascade laser beam source which is manufactured by the manufacturing method in the related art has a configuration in which only the ridge portion corresponding to the upper contact layer protrudes, the electrode in contact with the exposed portion of the upper contact layer and the electrode in contact with the exposed portion of the lower contact layer have a height difference, and the unevenness of the surface on which the electrodes are formed is large (a configuration with complicated electrode patterns) as described above. Such a semiconductor element is not easily connected to the sub mount by epi-side down assembly such that the electrodes thereof are in contact with each other. For example, in the semiconductor element 202 according to the comparative example illustrated in FIG. 8, a protruding resist portion 250 is formed to protect a device structure on the crystal growth surface side at the time of being bonded to the support substrate, but the resist portion remains and thus epi-side down assembly becomes more difficult. In this regard, in the manufacturing method according to this embodiment, since the circumferential edge portions 61 and 62 formed on both sides of the ridge portion 30 have the same height as the ridge portion 30 and the electrode pattern 82 in contact with the second area 22a is formed to the surfaces of the circumferential edge portions 61 and 62, the electrode pattern 81 formed in the ridge portion 30 and the electrode pattern 82 formed in the circumferential edge portions 61 and 62 (and the ridge portion 30) can be set to have the same height (see FIG. 3C or the like). Accordingly, as illustrated in FIG. 7, the semiconductor element 2 can be connected to the sub mount 100 by epi-side down assembly such that the electrode pattern 81 is in contact with the metal portion 101 of the sub mount 100 and the electrode pattern 82 is in contact with the metal portion 102. By connecting the semiconductor element 2 and the sub mount 100 by epi-side down assembly, heat generated from the semiconductor element 2 can be efficiently dissipated to the sub mount 100, and the semiconductor element 2 can perform an operation in a higher-temperature environment, or an operation with a high duty cycle or a continuous operation in which a thermal load is large.

In the manufacturing method according to this embodiment, in the step of forming the channel structures 51 and 52 and the circumferential edge portions 61 and 62, the channel structures 51 and 52 corresponding to the pair of first excavated portions 41 and 42 are formed at positions which are symmetric with the ridge portion 30 interposed therebetween (see FIG. 3A or the like). Accordingly, the distances by which the electrode patterns 82 on both sides are separated from the activation layer 25 are equal to each other (see FIG. 3C or the like) and the voltage drop is more appropriately curbed.

While an embodiment of the invention has been described above, the invention is not limited to the embodiment. For example, in the embodiment, the InGaAs current diffusion layer 22 and the Si substrate 93 are bonded using the bonding resin 94, but the bonding may be performed using direct bonding such as activation bonding or pressurization.

The Fe-doped (semi-insulating) InP single-crystal substrate 21 is completely removed to expose the InGaAs current diffusion layer 22, but the invention is not limited thereto and the Si substrate may be bonded in a state in which the Fe-doped (semi-insulating) InP single-crystal substrate is left thin. However, from the viewpoint that absorption of terahertz waves (absorption of free carriers) in the Fe-doped (semi-insulating) InP single-crystal substrate is curbed, it is preferable that the Fe-doped (semi-insulating) InP single-crystal substrate be thin to 150 μm.

The semiconductor element 9 is diced by stealth dicing, but the invention is not limited thereto and the dicing may be performed using a general dicing blade.

The semiconductor element 2 is connected to the sub mount 100 by epi-side down assembly, but the invention is not limited thereto and the semiconductor element may be connected to the sub mount, for example, by wire drop.

The configuration in which the InGaAs current diffusion layer 22, the lower InP clad layer 23, the lower InGaAs guide layer 24, the activation layer 25, and the upper InGaAs guide layer 26 are sequentially stacked has been described as a configuration of the Fe-doped (semi-insulating) InP single-crystal substrate 21, but the invention is not limited thereto and, for example, various forms may be used for the activation layer 25. Specifically, an activation layer using two or more types of unit stacked bodies may be used as the activation layer 25 in which unit stacked bodies are stacked in multiple stages. When the diffraction grating is formed in the upper InGaAs guide layer 26, frequencies corresponding to pump beams $\omega 1$ and $\omega 2$ may be generated using two types of gratings or a grating pattern in which two types are mixed. In this case, the acquired THz spectrum is a single mode. Even when an oscillation spectrum width increases to 1 THz or more in a Fabry-Perot operation, terahertz waves can be generated by the differential frequency, and it is not necessary to form the diffraction grating in the upper InGaAs guide layer 26. In this case, the acquired terahertz output is lower than that in a case in which the diffraction grating is formed.

What is claimed is:

1. A method of manufacturing a quantum cascade laser beam source, the method comprising:
    preparing a semiconductor stacked body having a lower contact layer, a lower clad layer, a lower guide layer, an activation layer, and an upper guide layer, sequentially stacked on an indium phosphide substrate;
    partially performing etching on the semiconductor stacked body to form a pair of first excavated portions having the lower clad layer exposed by the etching, and a ridge portion interposed between the pair of first excavated portions;
    partially performing etching on the pair of first excavated portions to form a second excavated portion having the lower contact layer exposed by the etching, and a circumferential edge portion formed to interpose the second excavated portion between the ridge portion and the circumferential edge portion after a doped layer has grown in the first excavated portions and the upper clad layer and the upper contact layer have grown in the first excavated portions and the ridge portion;
    forming an insulating film that excludes a first area being a partial area of the upper contact layer in the ridge portion, and a second area being a partial area of the lower contact layer in the second excavated portion, forming a first electrode in contact with the first area, and forming a second electrode in contact with the second area to form a semiconductor element;
    fixing a crystal growth surface side which is a side on which the first electrode and the second electrode are formed in the semiconductor element to a support substrate;
    removing the indium phosphide substrate of the semiconductor element fixed to the support substrate;
    fixing a silicon substrate to a surface of the semiconductor element from which the indium phosphide substrate has been removed; and
    peeling the support substrate from the semiconductor element after the silicon substrate has been fixed.

2. The method of manufacturing a quantum cascade laser beam source according to claim 1, further comprising a step of making the semiconductor element into a chip by performing stealth dicing along a predetermined cutting line after the step of peeling the support substrate.

3. The method of manufacturing a quantum cascade laser beam source according to claim 2, wherein the step of forming the semiconductor element comprises forming the second electrode in contact with the second area to a surface of the circumferential edge portion along the insulating film covering the circumferential edge portion, and
    wherein the method further comprises:
        a step of preparing a sub mount mounted with a third electrode and a fourth electrode on both sides of the third electrode; and
        a step of opposing a surface of the sub mount mounted with the third electrode and the fourth electrode with respect to a surface of the semiconductor element mounted with the first electrode and the second electrode, and connecting the semiconductor element to the sub mount by epi-side down assembly such that the first electrode is in contact with the third electrode and the second electrode is in contact with the fourth electrode after the step of making the semiconductor element into a chip.

4. The method of manufacturing a quantum cascade laser beam source according to claim 1, wherein in the step of forming the second excavated portion and the circumferential edge portion comprises forming the second excavated portions corresponding to the pair of first excavated portions at positions symmetric with the ridge portion interposed therebetween.

* * * * *